United States Patent [19]

Takeuchi et al.

[11] Patent Number: 4,579,804
[45] Date of Patent: Apr. 1, 1986

[54] METHOD AND MATERIAL FOR IMAGE FORMATION

[75] Inventors: Satoshi Takeuchi, Kawasaki; Masanori Akada; Ryohei Takiguchi, both of Tokyo; Yoshiaki Hida, Kawasaki; Hideki Takematsu, Koganei, all of Japan

[73] Assignee: Dai Nippon Insatsu Kabushiki Kaisha, Tokyo, Japan

[21] Appl. No.: 468,689

[22] Filed: Feb. 22, 1983

Related U.S. Application Data

[63] Continuation-in-part of Ser. No. 333,559, Dec. 22, 1981, abandoned.

[30] Foreign Application Priority Data

Dec. 23, 1980 [JP] Japan ................................ 55-182660
Dec. 23, 1980 [JP] Japan ................................ 55-182661

[51] Int. Cl.$^4$ .......................... G03C 1/62; G03C 5/34
[52] U.S. Cl. .................................... 430/153; 430/176; 430/177; 430/178; 430/413; 430/415; 430/417
[58] Field of Search ............... 430/153, 176, 177, 178, 430/413, 415, 417

[56] References Cited

U.S. PATENT DOCUMENTS 1,841,653  1/1932  Van der Grinten et al. ........ 430/178
3,320,064  5/1967  Hanson, Jr. et al. ............... 430/153
3,578,457  5/1971  Houtman et al. .................... 430/153
3,666,467  5/1972  Reynolds et al. .................... 430/153
3,793,030  2/1974  Asami .................................... 430/176
4,121,938  10/1978 Takeda et al. ........................ 430/415

OTHER PUBLICATIONS

L. K. H. van Beck, "Special Properties of Physical Development Processes", Photo. Sci. & Eng., vol. 20, No. 2, Mar./Apr. 1976, pp. 88–91.

*Primary Examiner*—Paul Lieberman
*Assistant Examiner*—Robert A. Wax
*Attorney, Agent, or Firm*—Parkhurst & Oliff

[57] ABSTRACT

An image forming material comprises an image forming layer disposed on a support and comprising (a) aqueous composition comprising a hydrophilic binder layer containing metal developing nuclei or their precursor compound, and water and (b) an organic composition comprising an oil-soluble development inhibitor which is a compound having a diazo group or azide group and a water-miscible organic solvent. An image is formed by exposing the image forming layer to patternized light and then contacting it with a developer containing reducible metal ions and a reducing agent thereby to form an image constituted by metal particles grown at the light-exposed parts.

8 Claims, 3 Drawing Figures

METHOD AND MATERIAL FOR IMAGE FORMATION

CROSS REFERENCE TO RELATED APPLICATIONS

This is a continuation-in-part of U.S. application Ser. No. 333,559, filed Dec. 22, 1981, now abandoned.

BACKGROUND OF THE INVENTION

This invention relates to an image forming material of the type capable of forming visible images by physical development and to a method for image formation by the use thereof.

Physical development refers to a process wherein an image forming layer containing minute metal nuclei forming a latent image is treated with a developer containing metal ions to be reduced and a reducing agent (hereinafter frequently called "physical developer") to give a visible image constituted of metal particles and is generally known as a method for forming silver images.

Recently, in view of limited availability of silver salts from natural resources, recourse has been made to non-silver image forming materials. However, the only practical image forming method utilizing physical development is formation of a conductive pattern on a print substrate.

As an image forming method utilizing physical development proposed in the prior art, there is a method in which the reaction involving conversion of ferric ions to ferrous ions by photoirradiation is utilized, and noble metal ions are reduced by the ferrous ions formed to give metal developing nuclei, which are in turn subjected to physical development. The developing nucleus forming systems to be used in this method include iron-gold systems, iron-mercury systems and iron-silver systems (namely systems giving a brown print).

It has also been proposed to utilize an organic compound as a photoreducing agent. For example, according to one method, there is employed a photosensitizer system comprising a combination of diazosulfonate and a watersoluble mercury compound capable of forming nuclei. When this system is exposed to light, sulfite ions of diazosulfonate are liberated, by which mono-valent mercury salts disproportionate to give zero-valent mercury, on which mercury nucleus silver is precipitated when contacted with a silver-containing physical developer to produce a visible image. In place of diazosulfonate, other photosensitive compounds capable of liberating $CN^-$, $CNS^-$, $NO^-$ or $S_2O_3^{2-}$ are also stated to be usable to obtain images (Japanese Patent Publication No. 3319/1962).

These methods, however, involve problems in treatment of waste liquors or in operation because mercury is employed.

Another method employs a photosensitizer system comprising a combination of a special diazonium salt such as hydroxybenzene diazonium salt and silver nitrate capable of forming nuclei. When this system is exposed to light, the diazonium salt is decomposed to produce phenol, and silver nuclei are formed by the reductive power of the phenol. A visible image can be obtained by contacting with a silver-containing physical developer. This is one example in which silver is used.

On the other hand, a research group to which we belong has already proposed a method in which a physical developer and a photosensitive resin are combined. That is, according to this method, light exposure and developing treatment are applied on a coating layer of a photosensitive resin to form a relief image through selective dissolution of the resin, simultaneous incorporation of metal nuclei in the relief image, followed by physical development. For formation of metal nuclei in the relief image, for example, the relief image may be treated first with an acidic aqueous palladium chloride solution and then with an acidic aqueous stannous chloride solution to form metallic palladium nuclei (Japanese Patent Application No. 102218/1980, filed on July 25, 1980).

This method achieves patternization of metallic latent images by utilizing the relief-pattern-forming capability of the photosensitive resin per se, but it involves a drawback in that sufficient resolution cannot be obtained because patternization is obtained as relief images.

The use of titanium oxide (U.S. Pat. Nos. 2,738,272 and 2,929,709), anthraquinone (U.S. Pat. No. 2,504,593) and tin chloride [Plating 58, 786(1971)]is also known and practiced, but each of these methods is utilized only as a pattern forming method on a print substrate.

In the case where titanium oxide is used, the products will have intransparent non-image portions. Although sodium anthraquinone-2,6-disulfonate is practically used in preparation of a print substrate, it is limited to a combination of a divalent copper salt such as cupric formate and cupric gluconate with nickel chloride, cobalt chloride or iron sulfate. Alternatively, when tin chloride is used, there are problems such as stannous chloride being readily oxidized by oxygen in the air to have a short life and the impossibility of using a light source with high power because the photosensitive wavelength is around 250 nm.

SUMMARY OF THE INVENTION

A principal object of the present invention is to provide a novel method for image formation which utilizes a physical development but is based on a principle different from those of the methods for image formation of the prior art as described above and also to provide an image forming material to be used therefor.

As the result of our various investigations made with the above object in view, it has now been found that physical development, using nuclei of a metal such as gold, platinum, palladium, silver, iron or copper as developing nuclei, can effectively be inhibited by a compound having a diazo group or an azide group which is photodecomposable per se.

While the mechanism of this phenomenon has not been clarified so far, it may be speculated that the physical development is inhibited by the compound per se having a diazo group or an azide group or by the reaction product obtained by treatment of these compounds with a physical developer. The structure of the compound obtained by such a treatment with a physical developer is not clear, but it is estimated to have undergone some chemical changes in view of the fact that the compound having a diazo group or an azide group becomes undecomposable by light after physical development.

The image forming material according to the present invention is based on the finding described above and, more particularly, comprises a support and an image forming layer provided on the support, the image forming layer comprising (a) an aqueous composition comprising a hydrophilic binder, a metal developing nucleus source and water and (b) an organic composition comprising an oil-soluble development inhibitor selected from compounds each having a diazo group or azide group, and a water-miscible organic solvent.

The developing nucleus source in the above image forming material can be metal developing nuclei per se or a metal compound capable of providing metal developing nuclei by reduction thereof. According to the method for image formation of the present invention, the image forming layer of the image forming material is exposed to pattern light, and then physical development is performed to obtain a visible image. In the case where the developing nucleus source is a metal compound, it is necessary that the metal developing nuclei be formed by reduction prior to physical development. Light exposure has substantially nothing to do with the formation of the metal developing nuclei. Thus, the reduction treatment for formation of metal developing nuclei may be carried out either before or after the light exposure step. Alternatively, it may also be carried out in a physical developer substantially simultaneously with physical development.

The pattern light exposure step in the method for image formation of the present invention has the effect of depriving the light-exposed portions in the image forming layer of the physical-development-inhibitory effect of a compound having a diazo group or an azide group as physical-development inhibitor by selective decomposition of the compound. Accordingly, in the subsequent physical development, metal ions in a physical developer are precipitated and grown as a metal in the presence of metal developing nuclei. In contrast, at non-exposed portions, no such precipitation and growth of a metal occurs, which results in a visible image comprising metal particles selectively grown at the exposed portions. Thus, the most unique and important feature of the image forming method of the present invention resides in providing metal developing nuclei by reduction or inclusion thereof and irrelevantly to light exposure, and in carrying out decomposition of a physical-development inhibitor in the light exposure step, as contrasted to the methods of prior art, wherein metal developing nuclei are generated in the light exposure step.

The nature, utility, and further features of this invention will be more clearly apparent from the following detailed description, beginning with a consideration of general aspects of the invention and concluding with specific examples of practice thereof, when read in conjunction with the accompanying drawing, briefly described below. Unless otherwise noted, all "%" and "parts" are by weight.

DETAILED DESCRIPTION OF THE INVENTION

The compound having a diazo group or an azide group (development inhibitor) to be contained in the image forming layer of the image forming material of the present invention or such a compound after treatment with a physical developer has a physical development inhibitory effect as will be apparent from the phenomena described below:

(a) When physical developing treatment is applied without light exposure on the image forming layer (containing metal developing nuclei, if necessary, as a result of reduction treatment) from which the development inhibitor has been removed, physical development is effected all over the surface.

(b) When (reduction treatment and) physical developing treatment are applied on the image forming layer containing the development inhibitor of the present invention without light exposure, no physical development effect is obtained. Even in this case, however, if the treatment with a physical developer is conducted for a long time, gradual growth of nuclei as well as a development effect become recognizable. This is considered to be due to dissolution of the development inhibitor into the developer or gradual decomposition thereof in the presence of the developer.

(c) When the developing nucleus source in the image forming layer is a metal compound, images can be obtained at the exposed portions by physical development after reduction of the metal compound, irrespectively of whether the reduction is performed before or after pattern light exposure.

(d) When the developing nucleus source is a metal compound, if pattern light exposure and physical developing treatment are carried out without a separate reducing treatment, desired images can be obtained only when the physical developer contains a reducing agent strong enough to reduce the metal compound to form metal developing nuclei simultaneously with physical development.

(e) The image forming layer according to the present invention can be developed within an ordinary physical development time only when it is subjected to light exposure.

The physical-development-inhibitory effect of the compound having a diazo group or an azide group as described above has been found for the first time by us. Each of the metal developing nuclei herein used is a minute metal particle stably formed, which is not itself visible to the naked eye but functions already as a physical developing nucleus. The present invention is fundamentally different from the method of prior art, wherein metal developing nuclei are formed at the exposed portion by utilizing a photochemical reaction, in that such minute metal developing nuclei may be already contained in the image forming layer before light exposure.

Figure 1:
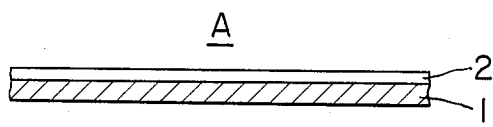
FIG. 1 is a schematic sectional view taken along the perspective of thickness, which illustrates conceptionally the layer structure of one embodiment of the image forming material according to the present invention.

As can be seen from one embodiment of the invention shown in FIG. 1, the image forming material A of the present invention comprises a planar support 1 and an image forming layer 2 provided on the support 1.

As the support 1, any solid material such as glass, wood, paper, plastic film, woven fabric or non-woven fabric may be employed. Among such materials, a plastic film such as polyester film or triacetate film is particularly preferable. Such a support 1 may be subjected to a pre-treatment, if desired, such as a corona discharge treatment or a primer treatment for improvement of adhesiveness before provision of the image forming layer 2.

The image forming layer 2 comprises a metal developing nucleus source and a development inhibitor dispersed, or preferably dissolved, in a hydrophilic binder layer.

As the binder, a naturally occurring macromolecular compound such as gelatin, casein, glue, gum arabic or shellac, carboxylmethyl cellulose, ovalubumin, polyvinyl alcohol (partially saponified polyvinyl acetate), polyacrylic acid, polyacrylamide, polyvinyl pyrrolidone, polyethylene oxide, maleic acid copolymer or the like may be used. Other resins may also be used as long as they are water-soluble or hydrophilic. The degree of hydrophilicity required for the binder is such that physical development will be possible by permeation of a physical developer into the image forming layer 2 when the image forming layer 2 is formed therefrom and contacted with a physical developer.

The metal developing nucleus source is in the form of metal developing nuclei per se or a metal compound which can produce metal developing nuclei by reduction.

As metal developing nuclei, minute particles of a metal such as palladium, silver, iron, copper, gold, or platinum may be employed. Among such materials, minute particles of palladium, iron, copper, gold or platinum are preferred. The degree of minuteness is such that it can result in an image forming layer which is apparently colorless to the naked eye, and that the particles are capable of functioning as physical developing nuclei.

As a metal compound which can provide metal developing nuclei by reduction, any of water-soluble salts of the metals as mentioned above such as chlorides or nitrates, as exemplified by water-soluble salts such as palladium chloride, silver nitrate, gold hydrogen tetrachloride and the like which are contained in activator solutions in electroless plating is used. Among these, a water-soluble salt of palladium, gold, platinum or copper, especially a water-soluble salt of palladium, is preferable.

A coating solution for providing an image forming layer 2 containing metal developing nuclei can be prepared by dispersing minute metal particles of appropriate sizes as mentioned above together with a development inhibitor into a hydrophilic resin solution. More preferably, an aqueous solution containing minute metal nuclei prepared by mixing an aqueous solution of a metal compound as mentioned above (commercially available activator for electroless plating may be applicable) with an aqueous reducing agent solution such as an aqueous stannous chloride-hydrochloric acid solution, an aqueous stannous sulfate solution, or the like (commercially available sensitizer for electroless plating may be applicable) is mixed with a binder resin solution and a development inhibitor, and then formulated into a coating solution with a viscosity of the order of 10 to 1000 centipoises suitable for coating. As a solvent, other than water, a solvent mixture of water with a water-miscible solvent such as a lower alcohol, a ketone or an ether may also be used.

A coating solution for providing an image forming layer 2 containing a metal compound can of course be obtained according to the procedure for forming the above coating solution by omitting the use of a reducing agent.

The image forming layer 2 is obtained as a coated film generally with a thickness of 1 to 30 $\mu$ by applying a coating solution prepared in the manner as described above on a support 1, and then drying.

Alternatively, the image forming layer 2 may also be formed by previously forming only a hydrophilic binder layer on the support 1, then treating this binder layer with an aqueous solution containing readily reducible metal ions as described above and further, if desired, treating the thus treated layer with an aqueous reducing agent solution.

As a compound having a diazo group or an azide group to be used as a development inhibitor, for example, as a preferable compound having diazo groups, any of water-soluble zinc chloride complex salts, sulfates, and phosphates having diazo groups or diazo resins derived from these compounds is used. More specifically, examples of suitable compounds are p-N,N-diethylaminobenzenediazonium chloride-zinc chloride complex, p-N-ethyl-N-$\beta$-hydroxyethylaminobenzenediazonium chloride-zinc chloride complex, p-N,N-dimethylaminobenzenediazonium chloride-zinc chloride complex, 4-morpholinobenzenediazonium chloride-zinc chloride complex, 4-morpholino-2,5-diethoxybenzenediazonium chloride-zinc chloride complex, 4-morpholino-2,5-dibutoxybenzenediazonium chloride-zinc chloride complex, 4-benzoylamino-2,5-diethoxybenzenediazonium chloride-zinc chloride complex, 4-(4'-methoxybenzoylamino)-2,5-diethoxybenzenediazonium chloride-zinc chloride complex, 4-(p-tolylmercapto)-2,5-dimethoxybenzenediazonium chloride-zinc chloride complex, 4-diazodiphenylamine-zinc chloride complex, 4-diazo-4'-methoxydiphenylamine-zinc chloride complex, 4-diazo-3-methoxy-diphenylamine-zinc chloride complex, sulfates and phosphates corresponding to the above zinc chloride complexes, and also diazo resins which are reaction products of these diazonium compounds with paraformaldehyde. Examples of appropriate azide compounds are p-azidobenzalaldehyde, p-azidoacetophenone, p-azidobenzoic acid, p-azidobenzalacetophenone, p-azidobenzalacetone, 4,4'-diazidochalcone, 2,6-bis-(4'-azidobenzal)-acetone, 4,4'-diazidostilbene-2,2'-disulfonic acid, p-azidobenzoyl chloride, 3-azidophthalic anhydride, 4,4'-diazidodiphenyl sulfone, p-azidocinnamic acid and sodium 4,4'-diazidobenzoyl-acetone-2,2'-sulfonate.

Further, as a development inhibitor, an oil-soluble compound having a diazo group or an azide group can also be used suitably. By utilizing such an oil-soluble development inhibitor, it is possible to prevent fogging due to elution of the development inhibitor into a developer during physical development.

Examples of suitable oil-soluble development inhibitors are: (1) borofluorides of compounds having diazo groups such as p-N,N-diethylaminobenzenediazonium borofluoride, p-N-ethyl-N-$\beta$-hydroxyethylaminobenzenediazonium borofluoride, p-N,N-dimethylaminobenzenediazonium borofluoride, 4-morpholinobenzenediazonium borofluoride, 4-morpholino-2,5-diethoxybenzenediazonium borofluoride, 4-morpholino-2,5-dibutoxybenzenediazonium borofluoride, 4-benzoylamino-2,5-diethoxybenzenediazonium borofluoride, 4-(4'-methoxybenzoylamino)-2,5-diethoxybenzenediazonium borofluoride, 4-(p-tolylmercapto)-2,5-dimethoxybenzenediazonium borofluoride, 4-diazodiphenylamine borofluoride, 4-diazo-4'-methoxydiphenylamine borofluoride, and 4-diazo-3-methoxydiphenylamine borofluoride; (2) diazo resins which are reaction products of these diazonium compounds with paraformaldehyde; and (3) oil-soluble azide compounds such as p-azidoacetophenone, 4,4'-diazidochalcone, 2,6-bis-(4'-azidobenzal)-acetone, 2,6-bis-(4'-azidobenzal)-cyclohexanone, 2,6-bis-(4'-azidobenzal)-4-methylhexanone, 2,6-bis-(4'-azidostyryl)-acetone, and azidopylene.

In order to obtain a coating solution for providing an image forming layer 2 by using an oil-soluble development inhibitor, either a method (a) which involves kneading the oil-soluble development inhibitor with a minor quantity of a binder solution to finely disperse the oil-soluble development inhibitor in the binder solution and mixing the resultant dispersion with the remaining binder solution containing a metal compound, or a method (b) which involves dissolving the oil-soluble development inhibitor, preferably in the form of minute particles, in a water-miscible solvent or a mixture of this type of a solvent with water and mixing the solution thus obtained with an aqueous binder solution containing a metal compound can be employed. Examples of water-miscible solvents are cellosolve acetate, methyl cellosolve, dimethylformamide, methyl alcohol, ethyl alcohol, acetonitrile, tetrahydrofuran, pyridine, methyl ethyl ketone, and isophorone.

In the image forming layer 2, the metal compound may be contained in a ratio of 0.01 to 100 parts, particularly 0.01 to 1 part, and the development inhibitor in a ratio of 1 to 100 parts, particularly 5 to 50 parts, per 100 parts of the above binder.

After formation of the image forming layer 2, it is desirably subjected to a film hardening treatment in order to prevent dissolution of the binder into the developer during physical developing treatment. The film hardening treatment can be carried out by mixing a compound selected from those mentioned below into the coating solution for formation of the image forming layer 2 in a quantity of, for example, 0.1 to 50 parts per 100 parts of the binder or by applying an aqueous solution of such a compound as a coating on the image forming layer:

Aluminum compounds such as potassium alum, ammonium alum, etc.; chromium compounds such as chromium alum, chromium sulfate, etc.; aldehydes such as formaldehyde, glyoxal, glutaraldehyde, 2-methylglutaraldehyde, succinaldehyde, etc.; diketones such as o-benzo quinone, p-benzoquinone, cyclohexane-1,2-dione, cyclopentane-1,2-dione, diacetyl, 2,3-pentane dione, 2,5-hexane dione, etc.; epoxides such as triglycidylisocyanurate, etc.; acid anhydrides such as tetraphthaloyl chloride, 4,4'-diphenylmethanedisulfonyl chloride; tannic acid; gallic acid; 2,4-dichloro-S-hydroxy-S-triazine; phosphorus compounds or carbodiimides represented by the formulas: $R_2NPOX_2$, $(R_2N)_nPOX_{3-n}$,

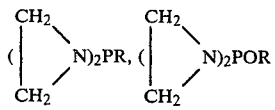

and $R-N=C=N-R'$ (wherein R is an alkyl group having 2 to 6 carbon atoms, R' is a group: $(CH_3)_3N^+(CH_3)_3X^-$, X is F or Cl and n is 1 or 2); resins such as styrene/maleic acid copolymer, vinyl pyrrolidone/maleic acid copolymer, vinyl methyl ether/maleic acid copolymer, ethyleneimine/maleic acid copolymer, methacrylic acid/methacrylonitrile copolymer, polymethacrylamide, methacrylate copolymers and others; organic acids including dicarboxylic acids such as glutaric acid, succinic acid, aspartic acid, etc.; hydroxycarboxylic acids such as malic acid, lactic acid, citric acid, glycolic acid, tartaric acid, etc.; nitrogen containing compounds such as dimethylol urea, trimethylol melamine; and others.

Using the thus prepared image forming material of the present invention, images can be formed according to the method of the present invention which comprises the following variations.

METHOD I

Figure 2:
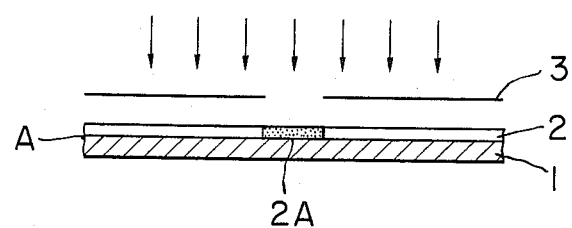
FIGS. 2 and 3 are similar sectional views for illustration of the intermediate steps in the image forming method of the present invention in which an image forming material as shown in FIG. 1 is employed.

First, the case wherein the image forming layer 2 already contains metal developing nuclei will be described. In this case, pattern light exposure is carried out on the image forming layer 2 of the image forming material A as prepared above through, for example, a transparent copy 3 as shown in FIG. 2. As a result, the development inhibitor is selectively decomposed at the exposed portions 2A and correspondingly to the dosage of exposure. As a light source, any light source can be employed as long as it can decompose diazo compounds or azide compounds as enumerated above. For example, an ultra-high-pressure mercury lamp, high-pressure mercury lamp, low-pressure mercury lamp, metal halide lamp, arc lamp, chemical lamp, xenon lamp, argon laser or the like may be employed. In accordance with the desired image gradation, light exposure is carried out, for example, when using UV-rays with a central wavelength of 405 nm, with an intensity of 1 W/m² to 300 W/m² for 10 to 200 seconds.

Figure 3:
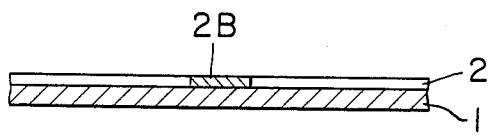

As the next step, the image forming layer 2 having a latent image of the development inhibitor decomposed in the image of the pattern by such a pattern light exposure is contacted with a physical developer by immersion or coating thereby to form a visible image 2B as shown in FIG. 3 in which the metal in the developer is precipitated and grown through reduction at the exposed portions around the centers of the metal developing nuclei.

As the physical developer, an aqueous solution containing a water-soluble, reducible heavy metal salt and a reducing agent is used, if desired under heating.

As the reducible heavy metal salt, it is possible to use a water-soluble salt of a metal of Group VIII such as nickel, cobalt iron or platinum, a metal of VIb such as chromium, a metal of the Group Ib such as copper, silver and gold, a metal of the Group IIb such as zinc or cadmium, and a metal of the Group IVa such as tin or lead, either singly or as a mixture. Examples of suitable watersoluble, reducible heavy metal salts are: heavy metal halides such as cobaltous chloride, cobaltous iodide, ferrous bromide, ferrous chloride, chromic bromide, chromic iodide, and cupric chloride; heavy metal sulfates such as nickel sulfate, ferrous sulfate, cobaltous sulfate, chromic sulfate, and cupric sulfate; heavy metal nitrates such as nickel nitrate, ferrous nitrate, cobaltous nitrate, chromic nitrate, and cupric nitrate; and organic acid salts of heavy metals such as ferrous acetate, cobaltous acetate, chromic acetate, and cupric formate.

These heavy metal salts to be reduced are contained in the physical developer in a ratio of 1 to 100 g/liter, particularly 3 to 50 g/liter.

Examples of suitable reducing agents are hypophosphorous acid, sodium hypophosphite, hydrazine, formalin, and boron type reducing agents such as sodium borohydride, diethylamine borane, dimethylamine borane, trimethylamine borane, borane, diborane, methyldiborane, diborazane, borazene, t-butylamine borazane, pyridine borane, 2,6-lutidine borane, ethylenediamine borane, hydrazine diborane, dimethylphosphine borane, phenylphosphine borane, dimethylarsine borane, and diethylstibine borane.

These reducing agents are used in the physical developer in a ratio of, for example, 0.1 to 50 g/liter.

For the purpose of preventing precipitation of the heavy metal ions formed by dissolution of the aforesaid reducible heavy metal salt as hydroxides, the physical developer may also contain one or more species of complex forming agents selected from organic carboxylic acids including mono-carboxylic acids, di-carboxylic acids, and hydroxycarboxylic acids such as malic acid, lactic acid, succinic acid, citric acid, aspartic acid, glycolic acid, tartaric acid, ethylenediamine tetraacetic acid, gluconic acid, saccharic acid, quinine acid, etc. These complex forming agents are contained in the physical developer in a ratio of, for example, 1 to 100 g/liter.

Further, for improvement of preservability, operability as well as image quality obtained, additives such as pH controllers (e.g., acid and base), buffering agents, preservatives, whitening agents, surfactants and others may be added, if desired, in the conventional manner to the physical developer.

In case the image forming layer 2 contains a metal compound which can give metal developing nuclei by reduction, image formation is possible according to various methods as described below.

METHOD II

Similarly as in Method I, pattern light exposure is carried out on the image forming layer 2 as described with reference to FIG. 2. Then, the image forming layer 2 having a latent image 2A of the development inhibitor decomposed in the image of the pattern is contacted with an aqueous reducing agent solution by immersion or coating to generate metal developing nuclei substantially uniformly in the image forming layer 2. As the reducing agent, stannous chloride, stannous sulfate, or any of the boron type reducing agents such as sodium borohydride et seq., as mentioned as a reducing agent in a physical developer in Method I, or the like is used. Particularly desirable is an acidic stannous chloride solution, stannous sulfate solution (Weiss solution) or a commercially available sensitizer solution for electroless plating. Generally, all strong reducing agents can be used. In the reducing treatment herein used, a reducing agent solution with a concentration which is different depending on the strength of the reducing agent employed but is generally in the range of 0.1 to 50 g/liter is used, and the treatment is conducted at room temperature or under heating for 10 to 400 seconds.

Further, the image forming layer 2 thus prepared having metal developing nuclei and a latent image 2A formed through selective decomposition of the development inhibitor is contacted similarly as in Method I with a physical developer by immersion or coating to form a visible image 2B as shown in FIG. 3 in which the metal in the developer is precipitated at the exposed portions around the centers of the metal developing nuclei.

METHOD III

In Method II, some of the effective reducing agents in the physical developer overlap or coincide with the reducing agents for generation of metal developing nuclei. Accordingly, when a physical developer containing a relatively strong reducing agent is used, no separate reducing treatment for generation of metal developing nuclei is carried out after light exposure, but treatment with a physical developer is directly applied to cause generation of metal developing nuclei substantially simultaneously with physical development.

METHOD IV

On the image forming material A as shown in FIG. 1, the reducing treatment for generation of metal developing nuclei, pattern light exposure treatment, and physical developing treatment are successively applied in the order mentioned. Individual treatment steps are not substantially different from those in case of Method II.

This method, while it involves a problem of additional steps of washing with water and drying required before light exposure as compared with Methods II and III, can also give similar images.

Having described above the principal modes of the image forming methods according to the present invention, reference is now made to some modifications as set forth below, which we have also found to bring about improved results.

Modification 1

The physical-development-inhibitory effect of the diazo compounds as development inhibitors is not lost when it is converted to a diazo dye by the reaction with a coupling agent. Therefore, after light exposure necessary for decomposition of a diazo compound and prior to physical development, such a coupling reaction can be carried out.

As coupling agents, all compounds which can react with diazo compounds can be employed. However, compounds having phenolic hydroxyl groups and compounds having aromatic amines as well as compounds having active methylenic hydrogens are preferable. Example compounds are enumerated below.

Resorcins: 4-benzoyl resorcin, resorcin, 2-methyl resorcinol, 5-methyl resorcinol, diresorcinol sulfide, diresorcinol;

Phloroglucins: phloroglucin, phloroglucide formate, phloroglucide acetate;

Pyrazolones: polyresorcin pyrazolone, 1-phenyl-3-methyl pyrazolone, 4,4'-bis(1-phenyl3-methyl-5-pyrazolone);

Naphthols: 2-hydroxy-3-naphthoic acid-2'-ethoxyanilide, 2-hydroxy-3-naphthoic acid-2',5'-dimethoxyanilide, 2-hydroxy-3-naphthoic acid-2'-methoxy-5'-nitroanilide, 2-hydroxy-3-naphthoic acid-2'-methyl-4'-chloroanilide, 2-hydroxy-3-naphthoic acid-morpholinopropioamide, 2-hydroxy-3-naphthoic acid-ethanolamide, dihydroxynaphthalene, 2-hydroxy-2-naphthoic acid-naphthoamide, sodium 1,8-dihydroxynaphthalene-3-sulfonate, sodium 1,8-dihydroxynaphthalene-4-sulfonate, sodium 1-hydroxy-8-benzoylaminonaphthalene-3-sulfonate, sodium 1-hydroxy-8-phenylaminonaphthalene-4-sulfonate, sodium 1-hydroxy-8-methylaminonaphthalene-5-sulfonate, sodium 1-hydroxy-naphthalene-4-sulfonate, 2,3-dihydroxy-naphthalene, 2,3-dihydroxynaphthalene-6-sulfonic acid, H acid, G acid, NW acid, R acid, sodium 2,8-dihydroxynaphthalene-6-sulfonate;

Acidic coupler: 2-hydroxy-3-naphthoic acid, 2-hydroxy-6-naphthoic acid, 2-hydroxy-1-naphthoic acid, 2,6-dihydroxy-benzoic acid, 2,4-dihydroxy-benzoic acid, 3,5-dihydroxybenzoic acid, 2,4,6-trihydroxy-benzoic acid, cyanoacetic acid;

Others: m-hydroxyphenyl urea, N,N'-ethylene-bis-acetoacetoamide, 2,6-dihydroxyacetophenone, acetoacetoanilide, 2,4,6-trihydroxyacetophenone, N-benzylacetoacetoamide, catechol, 5,5'-dimethyl-1,3-cyclohexane dione, acetoacetic acid benzylamide, malonic acid, acetonylacetone, 2,4-dihydroxy-benzoic acid ethanolamide, 3,5-dihydroxy-benzoic acid ethanolamide, 4-hydroxy-coumarin, 2,5-dimethyl-4-morpholinomethylphenol, 8-oxyquinoline.

The above coupling agents can be incorporated in the image forming layer 2 and allowed to react with diazonium compounds according to several methods as described below.

(1) A coupling agent is previously incorporated at the time of forming of the image forming layer 2, and the coupling reaction is carried out after light exposure.

The coupling agent is contained in a ratio of 1 to 100 parts, particularly preferably 20 to 50 parts, per 100 parts of the binder.

For causing a compound having diazo group at the unexposed portions in the image forming layer 2 having a latent image in the image of a pattern of the diazo compound decomposed by pattern light exposure to react with a coupling agent, the diazo compound at the unexposed portions is reacted with a coupling agent while the layer is contacted by ammonia vapor or is heated thereby to form a diazo dye.

As the method for causing ammonia vapor to contact the image forming layer, for example, the image forming layer can be passed through the developing section of a known diazo copying machine having an ammoniacal developing section for a residence time of 5 to 10 seconds, or alternatively it can be left to stand in a desicator saturated with ammonia vapor for 5 to 15 seconds. As the method for heating, heating may be conducted in a hot air furnace at a temperature of 50° C. to 150° C. for 30 seconds to 2 minutes, by contacting with a hot plate at 100° C. to 150° C. for 5 to 15 seconds, or also by radiation from an IR heater. It is also possible to use the method of contacting with ammonia vapor in combination with the method of heating.

(2) The image forming layer after light exposure is treated by immersion or coating with a solution of a coupling agent mentioned above which is prepared by dissolving in water, an alcohol, dimethylformamide, methyl cellosolve, or the like and made alkaline by addition of ammonia or the like to carry out the reaction between the diazo compound at unexposed portions and the coupling agent.

Unless the above coupling reaction is performed, yellow products formed at the unexposed portions, which are apparently auto-coupling reaction products of the diazo compound, do not transmit UV-rays and therefore inconveniences are caused in application of the image obtained by the present invention as a mask. In contrast, when such a coupling reaction as described above is carried out, the unexposed portions are colored by the diazo dye, but such coloration in visible regions does not affect transmittance of UV-rays, and therefore there is no inconvenience in application as a masking material.

Modification 2

In Methods II to IV, the metal developing nuclei formed in the image forming layer are not yet fully stable and may sometimes lose their function as nuclei before being transferred to the next step of physical development. For example, when mating rolls generally employed for silver films for automatization are used as a conveying mechanism for transferring to the next physical development step, the metal developing nuclei may be transferred to the rolls or deactivated to lose their function as nuclei. For this reason, when physical development is performed in the second developing step, image formation sometimes may be achieved partially or not at all.

For overcoming this problem, in place of causing generation of metal developing nuclei merely by the reducing treatment of the image forming layer after pattern light exposure in Method II as described above, it is effective to treat the layer first with a physical developer (First Developer) containing a boron type reducing agent which is a relatively strong reducing agent and reducible metal ions not only to cause generation of physical developing nuclei but also to permit the developing nuclei to grow to the extent of producing a visible image with relatively lower transmission (optical) density of 0.08 to 0.5, and subsequently to treat the layer with a physical developer (Second Developer) containing a reducing agent which is weaker than a boron type reducing agent and reducible metal ions. When such a method is employed, the function of the nuclei as such is not lost in the second developing step, even when conveying the image forming material by means of mating rolls, since the physical developing nuclei are grown after the first developing step. Further, because the physical development is performed in the second developing step by using a relatively weak reducing agent, the transmission density of the visible image can be increased without impairing image qualities such as resolution or gradation reproducibility, as compared with the case when the final image is obtained only by the use of a First Developer containing a boron type reducing agent.

As a reducing agent weaker than a boron type reducing agent, for example, any of sodium hypophosphite, hydrazine, formalin, tartaric acid, glucose, phosphorous acid, etc. can be used. These reducing agents may be employed in the Second Developer in a ratio of 0.1 to 100 g/liter.

Modification 3

In practicing the above Methods I through IV, by performing the physical development in two steps, for example, first development in a nickel plating bath using a boron type reducing agent and then carrying out the second development under high speed plating conditions in a nickel or copper plating bath using sodium hypophosphite as a reducing agent at a high temperature of 65° C. to 90° C., a metal image with a metallic gloss can be formed on the binder surface. By treatment of the resulting image with, for example, an aqueous solution of 5% hydrochloric acid or 5% nitric acid, the binder at the non-image portions can be selectively removed.

Thus, according to the image forming method of the present invention, there can be obtained an image, which can be an alternative for an image by the silver salt photographic method, having a transmission optical density of 4 or higher, being capable of black images with gradation if desired and also having a high resolution due to the use of an image forming layer containing a photodecomposable development inhibitor in its uniformly dissolved state. Since the image is a metal image, corrections are possible by the use of a reducer such as Farmer reducer of red prussiate and Kodak R-4. By utilizing such characteristics, the image material obtained by the present method can be used as an alternative for lith film or a masking material. The relief image material obtained in the above Modification 3 may also be applicable as a printed circuit plate. Further, the image material obtained by the method of the present invention can also be used in lithography, since it has an image portion which is lipophilic in combination with the hydrophilic non-image portion. In this case, physical development is preferably performed under strong conditions to form metallic glossy images protruding by 0.01 to 10 μm, particularly 0.05 to 5 μm above the non-image portion. The resulting lithographic plate has an advantage in that the quality of finish of the plate can easily be confirmed by naked eye before printing.

In order to indicate more fully the nature and utility of this invention, the following examples are set forth, it being understood that these examples are presented as illustrative only and are not intended to limit the scope of the invention.

EXAMPLE 1

| Activator | | Sensitizer | |
|---|---|---|---|
| $PdCl_2$ | 2 g | $SnCl_2$ | 1 g |
| HCl | 20 ml | HCl | 40 ml |
| $H_2O$ | 1000 cc | $H_2O$ | 100 cc |

An activator (aqueous hydrochloric $PdCl_2$ solution) and a sensitizer (aqueous hydrochloric $SnCl_2$ solution) having the above compositions, respectively, were mixed in a weight ratio of 2:1. Using the thus prepared aqueous hydrochloric acid solution having Pd nuclei dispersed therein, a photosensitive material (coating solution for formation of image forming layer) of the following composition was prepared.

| | |
|---|---|
| Aqueous hydrochloric acid solution having Pd nuclei dispersed as prepared above | 30 g |
| Gelatin (P-2151, produced by Nitta Gelatin K.K.) (30% aqueous solution) | 10 g |
| Diazo resin (D-011, produced by Shinko Giken K.K.) (20% aqueous solution) | 2.5 g |
| Methyl vinyl ether/maleic acid anhydride copolymer (Gantretz 149, produced by Gokyo Sangyo K.K.) (5% aqueous solution) | 5.0 g |

The above photosensitive material was applied as coating on a polyester film (Lumilar S.100#, produced by Toray K. K.) adjusted to a temperature of 20° to 23° C., which had previously been subjected to plasma treatment, and dried sufficiently to prepare an image forming material (photosensitive film) having an image forming layer of a thickness of 4 μ.

The coated layer of the above photosensitive film was subjected to light exposure with a negative film contacted thereon by using an ultra-high pressure mercury lamp 2KW printer (at a distance of 100 cm from the light source), for 2 minutes. This step was followed by immersion of the film in boron-nickel plating bath (Shiba nickel dope, produced by Okuno Seiyaku K. K.) at 65° C. for 50 seconds to carry out development, and the developed film was dried.

The image obtained was black and was capable of resolving 300 lines/inch and 4% dots.

EXAMPLE 2

| Activator | | Sensitizer | |
|---|---|---|---|
| $HAuCl_4.4H_2O$ | 1 g | $SnCl_2$ | 1 g |
| HCl | 2 ml | HCl | 40 ml |
| $H_2O$ | 1000 cc | $H_2O$ | 100 cc |

An activator and a sensitizer having the above compositions, respectively, were mixed in a weight ratio of 2:1, and a photosensitive material with the following composition was prepared using the thus prepared Au nuclei dispersion.

| | |
|---|---|
| Au nuclei dispersion in aqueous HCl | 20 g |
| Gelatin (P-2222, produced by Nitta Gelatin K.K.) (30% aqueous solution) | 6.7 g |
| Diazo resin (D-011, produced by Shinko Giken K.K.) (20% aqueous solution) | 2.5 g |
| Tartaric acid | 0.05 g |

Using the photosensitive material, preparation of a photosensitive film, light exposure and development were conducted similarly as in Example 1, whereby a black image was obtained.

EXAMPLE 3

Two grams of $PdCl_2$ together with 20 ml of HCl were dissolved in 1,000 cc of water, and the following photosensitive material (coating solution for formation of image forming layer) was prepared by using 20 g of the $PdCl_2$ solution obtained.

| | |
|---|---|
| $PdCl_2$ solution with the above composition | 20 g |
| Gelatin (P-2151, produced by Nitta Gelatin K.K.) (30% aqueous solution) | 10 g |
| Diazo resin (D-011, produced by Shinko Giken K.K.) (20% aqueous solution) | 2.5 g |
| Glutaric acid | 0.12 g |

The above photosensitive material was applied as coating on a polyester film (Lumilar S·100#, produced by Toray Industries, Inc.) adjusted to a temperature of 30° C. to 40° C. and previously subjected to plasma treatment and was then dried to obtain a coating layer of a thickness of 5μ.

The photosensitive film (image forming material) thus prepared was exposed to light with a negative film contacted thereon, use being made of an ultra-high pressure mercury lamp 2kW printer (at a distance of 100 cm from the light source), for 2 minutes. Then the exposed film was subjected to reducing treatment by immersion in the following reducing bath for one minute:

| | |
|---|---|
| $SnCl_2$ | 1 g |
| HCl | 40 ml |
| $H_2O$ | 100 cc |

As the next step, treatment with a physical developer at 90° C. of a composition as shown below was applied to precipitate the metal and form a black image (image according to Method II):

| | |
|---|---|
| Nickel chloride | 30 g |
| Sodium hypophosphite | 10 g |
| Sodium oxyacetate | 50 g |
| Water | 900 g |

With the use of the same photosensitive film, the film was immersed in the reducing bath (30° C.) and, after washing with water and drying, was exposed to light with a negative film contacted thereon for 2 minutes, use being made of an ultra-high pressure mercury lamp 2KW printer (at a distance of 100 cm from the light source).

Then treatment with a physical developer at 90° C. of a composition as shown below (electroless plating solution) was applied to precipitate the metal and form a black image (image according to Method III):

| | |
|---|---|
| Nickel sulfate | 30 g |
| Sodium hypophosphite | 10 g |
| Sodium citrate | 10 g |
| Water | 950 g |

With the use of the same photosensitive film, light exposure was carried out on the film with a negative film contacted thereon for 2 minutes, by means of an ultra-high pressure mercury lamp 2KW printer (at a distance of 100 cm from the light source). Then, without performing special reducing treatment, development was performed by immersing the exposed film in a boron-nickel plating bath (Shiba nickel dope, produced by Okuno Seiyaku K. K.) at 65° C. for 50 seconds and then drying the same.

The image obtained (image according to Method IV) was capable of resolving 300 lines and 4% dots.

In this developing treatment, reduction and development were simultaneously performed. Two similar Examples are also set forth below.

EXAMPLE 4

A photosensitive film was prepared similarly as in Example 3 and subjected to light exposure through a negative film. Then, development was performed by immersion in a physical developer having the following composition at 30° C. for 2 minutes to obtain a black image (image according to Method III):

| | |
|---|---|
| Nickel chloride | 0.1 mole/liter |
| Dimethylamine borane | 0.1 mole/liter |
| Succinic acid | 0.5 mole/liter |
| pH | adjusted to 7.0 with NaOH |

EXAMPLE 5

Similarly as in Example 3, preparation of a photosensitive film and exposure were conducted, and the exposed film was developed by immersion in a physical developer (Narcus electroless plating solution) prepared by mixing a solution A and a solution B respectively having the compositions shown below in a ratio of 1:1 immediately before use:

| | |
|---|---|
| Solution A | |
| Copper sulfate | 60 g/liter |
| Nickel sulfate | 15 g/liter |
| Hydrazine sulfate | 45 g/liter |

| | |
|---|---|
| Solution B | |
| Sodium hydroxide | 45 g/liter |
| Potassium sodium tartarate | 180 g/liter |
| Sodium carbonate | 15 g/liter |

EXAMPLE 6

With the use of the aqueous hydrochloric $PdCl_2$ solution prepared similarly as in Example 3, a photosensitive material of the following composition was prepared, which was then applied as coating and dried on a polyester film similarly as in Example 3 to prepare a photosensitive film.

| | |
|---|---|
| Aqueous hydrochloric $PdCl_2$ solution | 20 g |
| Gelatin (P-2151, produced by Nitta Gelatin K.K.) (30% aqueous solution) | 10 g |
| Diazo resin (D-011, produced by Shinko Giken K.K.) (20% aqueous solution) | 2.5 g |
| Glutaraldehyde (50% aqueous solution) | 0.05 g |

Light exposure was carried out on the photosensitive film with a negative film contacted thereon for 2 minutes by means of an ultra-high pressure mercury lamp 2KW printer (at a distance of 100 cm from the light source), and then development was carried out by immersion in a boron-nickel plating bath (Shiba nickel dope, produced by Okuno Seiyaku K. K.) for 150 seconds, followed by drying.

Although the developing time was longer than in Example 1, the adhesiveness of the film was good and there was no peeling off of the film even when the film surface was rubbed by hand during development. The quality of the image (according to Method III) was also good (resolution: 300 lines/inch and 4% dots).

EXAMPLE 7

A photosensitive material of the composition shown below was prepared, and a photosensitive film was prepared therefrom similarly as in Example 3.

| | |
|---|---|
| Aqueous hydrochloric $PdCl_2$ solution (Redsumer, produced by Nippon Kanizen K.K.) | 20 g |
| Gelatin (P-2152B, produced by Nitta Gelatin K.K.) (20% aqueous solution) | 10 g |
| 4,4'-diazidodiphenyl sulfone (20% aqueous solution) | 2.0 g |
| Mucochloric acid | 0.06 g |

Light exposure, reduction and development were carried out all under the same conditions as in Example 3 to obtain a good black image in each of the cases of the Methods II, III, and IV.

EXAMPLE 8

A photosensitive film was prepared and exposed to light in the same manner as in Example 1 except that 2.0 g of NW acid (coupler) was added to the photosensitive material of Example 1.

Then the film was contacted with ammonia vapor for 30 seconds in a diazo copying machine for ammonia development thereby to cause a violet color to be produced at the unexposed portion. This step was followed by development by immersion in a boron-nickel plating bath (Shiba nickel dope, produced by Okuno Seiyaku K. K.) at 65° C. for 50 seconds, and the developed film was then dried.

The image obtained was black and capable of resolving 300 lines/inch and 4% dots.

EXAMPLE 9

A photosensitive film was prepared in the same manner as in Example 3 except that 2.0 g of NW acid (coupler) was added to the photosensitive material of Example 3.

Reduction and physical development according to the Methods II, III, and IV were performed, respectively, in the same manner as described in Example 3, except that the photosensitive film was contacted with ammonia vapor for 30 seconds in a diazo copying machine for ammonia development thereby to cause violet color to be produced at the unexposed portion. In each of the cases, a good black image (resolution: 300 lines/inch, 4% dots) was obtained.

EXAMPLE 10

An exposed photosensitive film prepared similarly as in Example 1 was subjected to the coupling treatment by immersion in the following coupling agent solution for 20 seconds to cause the unexposed portion to assume a violet color.

| NW acid | 10 g |
| --- | --- |
| Aqueous ammonia | 20 g |
| Water | 100 g |

As the next step, development was performed by immersion in a boron-nickel system plating bath (Shiba nickel dope, produced by Okuno Seiyaku K.K.) at 65° C. for 50 seconds, followed by drying.

The resulting image was black (resolution: 300 lines, and 4% dots).

EXAMPLE 11

A photosensitive film already subjected to light exposure, which was prepared similarly as in Example 3, was treated with a coupling agent similarly as in Example 10. Following the same procedure as in Example 3, reduction and physical development were carried out. As the result, a good black image according to Method II was obtained similarly as in Example 3.

EXAMPLE 12

Offset printing was carried out' with the use of an image material prepared similarly as in Example 1 as the printing plate. That is, the following compositions were prepared as separating solution or wetting solution for offset printing.

| Separating solution | |
| --- | --- |
| NH$_4$H$_2$PO$_4$ | 25 g |
| Carboxymethyl cellulose | 2.5 g |
| Water | Balance up to 1000 cm$^3$ |
| Wetting solution | |
| NH$_4$H$_2$PO$_4$ | 10 g |
| Ni(NO$_3$)$_2$.6H$_2$O | 15 g |
| Carboxymethyl cellulose | 4 g |
| Glycerine | 100 g |
| Water | Balance up to 1000 cm$^3$ |

Each solution was diluted 10-fold with water immediately before use. First, the 10-fold diluted separating solution was distributed over the entire surface of the above mentioned offset printing plate, which was then set in an offset printer (1800 CD, produced by Tokyo Koku Keiki K. K.), and printing was carried out by supplying the above wetting solution and conventional offset ink. As a result, 1000 sheets or more of printing could be repeated with no trouble.

EXAMPLE 13

When offset printing was carried out similarly as in Example 12 with the use of the image materials obtained according to Methods II, III, and IV of Example 3 as printing plates, 1,000 sheets or more of printing could be repeated with no trouble.

EXAMPLE 14

One gram of PdCl$_2$ together with 10 ml of HCl was dissolved in 1,000 ml of water, and, with the use of 10 g of the resulting PdCl$_2$ solution, a photosensitive material (coating solution for formation of an image forming layer) of the following composition was prepared.

| PdCl$_2$ solution of the above composition | 10 g |
| --- | --- |
| PVA (Gosenal F 330, produced by Nihon Gosei Kagaku K.K.) (10% aqueous solution) | 20 g |
| Diazo resin (D-011, produced by Shinko Giken K.K.) (20% aqueous solution) | 2 g |
| Glyoxal (1% aqueous solution) | 0.2 g |

The above photosensitive material was applied as a coating on a polyester film (Lumilar S-100, produced by Toray K. K.) previously subjected to plasma treatment and dried to provide a coating film with a thickness of 4 μ.

The photosensitive film (image forming material) thus obtained was exposed to light with a negative film contacted thereon for one minute by means of an ultra-high pressure mercury lamp 3KW printer (at a distance of 100 cm from the light source).

Next, this photosensitive film was immersed in an electroless nickel plating bath at 45° C. for 30 seconds to obtain a visible image at the exposed portion with a transmission density of about 0.08.

| Nickel sulfate | 20 g/liter |
| --- | --- |
| Potassium sodium tartarate | 40 g/liter |
| Sodium borohydride | 2.3 g/liter |
| pH (adjusted with NaOH) | 12.5 |

Then, as the second developer, an electroless nickel plating bath of the following composition was prepared in a bath equipped with a roll conveying device, and the photosensitive film was treated therein at 20° C. for 40 seconds.

| Nickel hypophosphite | 26.7 g/liter |
| --- | --- |
| Boric acid | 12 g/liter |
| Ammonium sulfate | 2.6 g/liter |
| Sodium acetate | 47 g/liter |
| pH | 5.5–6.0 |

As a result, an image with good tone reproducibility and a transmission density of 4.10 was obtained.

EXAMPLE 15

Preparation of a photosensitive film and light exposure were conducted in the same manner as in Example 1.

As the next step, the photosensitive film was immersed for 20 seconds in a non-electrolytic plating bath (Shiba nickel dope, produced by Okuno Seiyaku K. K.) containing a boron type reducing agent. This step was followed by a first light exposure to obtain a visible image on the exposed portion with a transmission density of 0.10. Then, as the second developer, TMP chemical nickel (produced by Okuno Seiyaku K. K.) for hypophosphite type electroless plating was charged into a bath equipped with a roll conveying device, and the above photosensitive film was treated in this bath for 40 seconds to obtain a black image with good tone reproducibility and a transmission density of 4.0.

COMPARATIVE EXAMPLE 1

A film was prepared according to the procedures in Example 14, and light exposure was carried out similarly. Then the exposed film was subjected to a reducing treatment by immersing it in the following reducing bath at 30° C. for 45 seconds. At this stage, no visible image was obtained.

| | |
|---|---|
| $SnCl_2$ | 1 g |
| HCl | 40 ml |
| $H_2O$ | 200 ml |

Subsequently, with the use of a physical developer at 90° C. of the composition shown below, which was charged into a bath employing a roll-conveying system, the above film was treated for 40 seconds. As the result, an image with a transmission density of 4.2 was obtained, but there were failures partially on the image.

| | |
|---|---|
| Nickel chloride | 30 g |
| Sodium hypophosphite | 10 g |
| Sodium oxyacetate | 50 g |
| Water | 900 g |

EXAMPLE 16

A photosensitive material of the following composition was prepared, and a photosensitive film was prepared therefrom in the same manner as in Example 14.

| | |
|---|---|
| Aqueous hydrochloric $PdCl_2$ solution (Redsumer, produced by Nippon Kanizen K.K.) | 20 g |
| PVA (Gosenal T-330H, produced by Nihon Gosei Kagaku K.K.) (10% aqueous solution) | 20 g |
| Diazo resin (D-012, produced by Shinko Giken K.K.) (20% aqueous solution) | 1.5 g |
| Chromium alum (1% aqueous solution) | 0.4 g |

The above photosensitive film was subjected to light exposure with a negative film superposed thereon for 40 seconds by means of a lamp for diazo copying (Ricoh High Start 4) and thereafter treated as a first development in a boron type electroless plating bath (Shiba nickel, produced by Okuno Seiyaku K. K.) at 45° C. for 25 seconds to form a visible image with a transmission density of 0.09 at the exposed portion. Then, as a second development, the film was further treated in a bath employing a roll-conveying system and containing a hypophosphite type electroless plating solution (TMP chemical nickel) at 20° C. for 40 seconds, whereby a black image without irregularity having a transmission density of 4.20 was obtained.

EXAMPLE 17

| Activator | | Sensitizer | |
|---|---|---|---|
| $PdCl_2$ | 2 g | $SnCl_2$ | 1 g |
| HCl | 20 ml | HCl | 40 ml |
| $H_2O$ | 1000 cc | $H_2O$ | 100 cc |

An activator (aqueous hydrochloric $PdCl_2$ solution) and a sensitizer (aqueous hydrochloric $SnCl_2$ solution) of the above compositions, respectively were mixed in a weight ratio of 2:1, and, with the use of the thus prepared aqueous hydrochloric acid solution having Pd nuclei dispersed therein, a photosensitive material (coating solution for formation of an image forming layer) of the following composition was prepared.

| | |
|---|---|
| Aqueous HCl solution having Pd nuclei dispersed | 30 g |
| Gelatin (P-2151, produced by Nitta Gelatin K.K.) (30% aqueous solution) | 10 g |
| Diazo resin (D-011, produced by Shinko Giken K.K.) (20% aqueous solution) | 25 g |
| Methyl vinyl ether/maleic acid anhydride copolymer (Gantretz 149, produced by Gokyo Sangyo K.K.) (5% aqueous solution) | 5.0 g |

The above photosensitive material was applied as a coating on a polyester film (Lumilar S·100#, produced by Toray K. K.) adjusted to a temperature of 20 to 23° C. and previously subjected to plasma treatment and dried to prepare an image forming material (photosensitive film) having an image forming layer with a thickness of $4\mu$.

The coating film of the above photosensitive film was exposed to light with a negative film contacted thereon for 2 minutes by means of an ultra-high pressure mercury lamp 2KW printer (at a distance of 100 cm from the light source).

Then, similarly as in Example 14, the first developing treatment and the second developing treatment were carried out to obtain an image without developing irregularity and with good tone reproducibility, having a transmission density of 4.0 as well as good dot resolution in a chart of 150 lines/inch for resolving power.

COMPARATIVE EXAMPLE 2

The same procedure as in Example 17 was repeated, but the developing treatment was carried out according to the first developing treatment in Example 1, to obtain an image with a transmission density of 1.6. This image was rather bold at the shadow portions and tone reproducibility was not good. Further, when the second developing was performed according to the same procedure as in Example 17, the non-image portion was also plated to result in ground fog.

EXAMPLE 18

A photosensitive liquid of the following composition was prepared.

| | |
|---|---|
| Gelatin (p-2151, produced by Nitta Gelatin K.K.) (7% aqueous solution) | 28.6 g |
| Aqueous hydrochloric PdCl₂ solution (10-fold dilution of Redsumer produced by Nippon Kanizen K.K.) | 14.0 g |
| 4-Morpholino-2,5-dibutoxybenzene-diazonium borofluoride (DH300BF₄, produced by Daito Kagaku K.K.) (2% DMF solution) | 3.0 g |
| Condensation product of p-diazodiphenyl-amine borofluoride and paraformaldehyde (5% DMF solution) | 0.7 g |
| N,N'—dimethylolurea (5% aqueous solution) | 0.5 g |

The above photosensitive liquid was applied as a coating with a wire bar #36 on a polyester film (Lumilar Q-80 of a thickness of 100μ, produced by Toray K.K.) previously subjected to a primer treatment. The coated film was dried and caused to undergo aging at 40° C. for 3 hours to obtain a photosensitivie film of a weight of 4.2 g/m² (dry basis).

The coated layer of the photosensitive film thus obtained was exposed to light with an image forming layer of a negative film contacted thereon by means of an ultra-high pressure mercury lamp 3KW (at a distance of 1 m from the light source) for 45 seconds at a wavelength of 365 nm at a rate of 50 mJ/cm² from the negative film side.

Subsequently, the exposed film was immersed in treatment solutions [A] and [B] having the compositions shown below for 30 seconds and 100 seconds, respectively, at a temperature of 25° C. [A] Shiba Nickel (produced by Oknuo Seiyaku K. K.)

| | part |
|---|---|
| Boron-containing reducing agent | 0.5 |
| Nickel sulfate | 3.0 |
| Sodium citrate | 1.0 |
| Sodium acetate | 2.0 |
| Water | 93.5 |

[B] 1:1 Mixture of TMP Chemical Nickel-A and -B

| | part |
|---|---|
| Nickel sulfate | 9.0 |
| Sodium hypophosphite | 7.0 |
| Aqueous NH₃ solution (28%) | 6.5 |
| Sodium citrate | 10 |
| Water | 67.5 |

The film thus developed was then washed with water and dried, whereupon a black image with a transmission density of 4.2 was obtained at the exposed portion. The image obtained reproduced 150 lines/inch and 4% to 97% dots.

When the film was developed by immersion in the solution [A] for 10 seconds and 20 seconds, respectively, the same images as those obtained in the case of 30 seconds' immersion could be formed.

EXAMPLE 19

A photosensitive liquid of the following composition position was prepared.

| | |
|---|---|
| Polyvinyl alcohol (T-330, produced by Nihon Gosei Kagaku K.K.) (10% aqueous solution) | 20 g |
| Aqueous hydrochloric PdCl₂ solution (10-fold dilution of Redsumer produced by Nippon Kanizen K.K.) | 10 g |
| 4-(p-Tolylmercapto)-2,5-dimethoxy-benzenediazonium borofluoride (5% dispersion in 10% T-330 aqueous solution) | 1.5 g |
| Condensation product of p-diazodiphenylamine borofluoride and paraformaldehyde (5% dispersion in 10% T-330 aqueous solution) | 0.6 g |
| N,N'—dimethylolurea (5% aqueous solution) | 0.5 g |

The above photosensitive liquid was applied as a coating with a wire bar #100 on a polyester film (Lumilar T-100 of a thickness of 100μ, produced by Toray K.K.) previously subjected to plasma treatment. The coated film was dried and caused to undergo aging at 30° C. for 2 days to obtain a hardened film of a weight of 4.3 g/m² (dry basis).

The coated layer of the film thus obtained was exposed to light with an image forming layer of a negative film contacted thereon by means of an ultra-high pressure mercury lamp 3KW (at a distance of 1 m from the light source) for 45 seconds at a rate of 50 mJ/cm² from the negative film side.

Subsequently, the exposed film was immersed in treatment solutions [A] and [B] having the following compositions for 5 seconds and 60 seconds, respectively, at a temperature of 25° C.

| | part |
|---|---|
| [A] Boron-containing reducing agent solution (NIKLAD 754-R-2, produced by Okuno Seiyaku K.K.) | 10 |
| Water | 190 |
| [B] Same as in Example 18 | |

The film was then washed with water and dried, whereupon a black image with a transmission density of 4.0 was obtained at the exposed portion.

We claim:

1. A method of forming an image, comprising:
  (a) dissolving an oil-soluble, light-sensitive development inhibitor in a water-miscible solvent and mixing the obtained solution with a hydrophilic binder solution containing a metal developing nucleus source to form a coating composition, said light-sensitive development inhibitor being present in a ratio of 1 to 100 parts per 100 parts of said binder and being selected from compounds each having a diazo group, said metal developing nucleus source being present in a ratio of 0.01 to 100 parts per 100 parts of said binder and comprising a metal compound capable of producing metal developing nuclei by reduction;
  (b) coating said coating composition on a support to form an image forming layer;
  (c) subjecting said image forming material to pattern light exposure;
  (d) contacting the light-exposed image forming layer with a reducing agent to form metal developing nuclei in said image forming layer; and
  (e) contacting said image forming layer with a physical developer containing reducible metal ions and a reducing agent thereby to form an image constituted by metal particles precipitated and grown by reduction of said reducible metal ions around the centers of metal developing nuclei at the light-exposed portion.

2. A method according to claim 1 wherein said first developing step and said second developing step are performed successively in the order mentioned.

3. A method according to claim 1 wherein said first developing step and said second developing step are performed substantially simultaneously be contacting the image forming layer with said physical developer and generating metal developing nuclei through the action of said reducing agent in the physical developer.

4. A method of forming an image, comprising:
 (a) coating on a support an image forming layer comprising an aqueous composition comprising a hydrophilic binder, a metal developing nucleus source in a ratio of 0.01 to 100 parts per 100 parts of said binder and water, and an organic composition comprising an oil-soluble light-sensitive development inhibitor in a ratio of 1 to 100 parts per 100 parts of said binder selected from compounds each having a diazo group or azide group, and a water-miscible organic solvent to form an image forming material, said metal developing nucleus source comprising a metal compound capable of producing metal developing nuclei by reduction;
 (b) contacting a reducing agent with said image forming layer thereby to form metal developing nuclei in the image forming layer;
 (c) subjecting said image forming layer to pattern light exposure; and
 (d) contacting the light-exposed layer with a developer containing metal ions to be reduced and a reducing agent thereby to form an image constituted by metal particles precipitated and grown by reduction of said metal ions to be reduced around the metal developing nuclei at the light-exposed portion.

5. A method according to claim 4 wherein the development inhibitor is a compound containing a diazo group.

6. A method according to claim 5 wherein the image forming layer further contains a coupling agent which produces a diazo dye through reaction with the compound containing the diazo group, and a coupling reaction is carried out by heating or contacting the image forming layer with ammonia gas after light exposure.

7. A method according to claim 5 wherein a coupling reaction is performed by contacting the image forming layer after light exposure with an alkaline aqueous solution of a coupling agent.

8. A method according to claim 1 wherein the physical development is performed in two steps, the first physical development being carried out with a physical developer containing a boron type reducing agent until a visible image with a transmission density of 0.08 to 0.5 is obtained, the subsequent development being carried out with the use of a physical developer containing a reducing agent with a reducing power weaker than the boron type reducing agent to obtain a visible image with a transmission density of 4.0 or more.

* * * * *